(12) United States Patent
Chen et al.

(10) Patent No.: US 6,943,062 B2
(45) Date of Patent: Sep. 13, 2005

(54) CONTAMINANT PARTICLE REMOVAL BY OPTICAL TWEEZERS

(75) Inventors: Hong-Miao Chen, Hsin chu (TW); Yu-Chang Jong, Hsin-chu (TW); Huan-Chi Tseng, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/689,430

(22) Filed: Oct. 20, 2003

(65) Prior Publication Data
US 2005/0081824 A1 Apr. 21, 2005

(51) Int. Cl.⁷ .............................................. H01L 21/44
(52) U.S. Cl. .................... 438/115; 438/120; 438/129; 438/597; 438/734; 438/906
(58) Field of Search ............................... 438/115, 906, 438/12, 597, 129, 734; 435/4, 6, 173, 29, 287; 219/121.6, 121.68, 121.84; 216/65

(56) References Cited

U.S. PATENT DOCUMENTS

| | | | |
|---|---|---|---|
| 3,808,550 A | * | 4/1974 | Ashkin ........................ 372/97 |
| 4,893,886 A | | 1/1990 | Ashkin et al. ................ 350/1.1 |
| 5,079,169 A | | 1/1992 | Chu et al. ..................... 436/172 |
| 5,245,466 A | * | 9/1993 | Burns et al. ................. 359/296 |
| 5,512,745 A | | 4/1996 | Finer et al. .................. 250/251 |
| 5,620,857 A | | 4/1997 | Weetall et al. ............... 435/7.1 |
| 5,689,109 A | | 11/1997 | Schutze ....................... 250/251 |
| 5,950,071 A | * | 9/1999 | Hammond et al. ......... 438/115 |
| 5,953,166 A | | 9/1999 | Shikano ....................... 359/837 |
| 6,055,106 A | | 4/2000 | Grier et al. .................. 359/566 |
| 6,139,831 A | | 10/2000 | Shivashankar et al. .. 424/82.05 |
| 6,216,538 B1 | * | 4/2001 | Yasuda et al. .............. 73/570.5 |
| 6,371,135 B1 | * | 4/2002 | Ryskoski ...................... 134/1.3 |
| 6,416,190 B1 | * | 7/2002 | Grier et al. .................. 359/614 |
| 6,566,169 B1 | * | 5/2003 | Uziel et al. .................. 438/115 |
| 2002/0108859 A1 | * | 8/2002 | Wang et al. ................. 204/547 |
| 2004/0036976 A1 | * | 2/2004 | Grier et al. .................. 359/614 |

* cited by examiner

*Primary Examiner*—David Zarneke
*Assistant Examiner*—Igwe U. Anya

(57) ABSTRACT

The invention describes how contaminant particles may be removed from a surface without in any way damaging that surface. First, the positional co-ordinates of all particles on the surface are recorded. Optionally, only particles that can be expected to cause current or future damage to the surface are included. Then, using optical tweezers, each particle is individually removed and then disposed of. Six different ways to remove and dispose of particles are described.

21 Claims, 2 Drawing Sheets

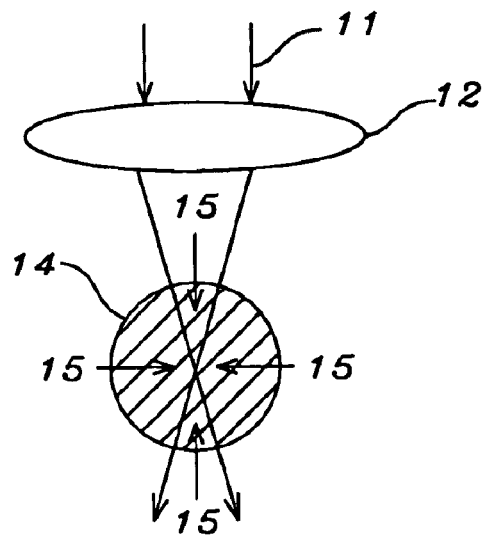
FIG. 1 - Prior Art
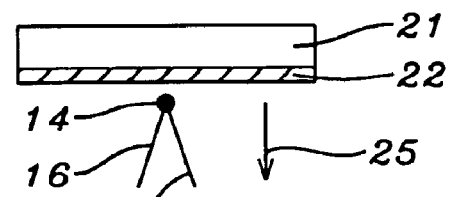
FIG. 2
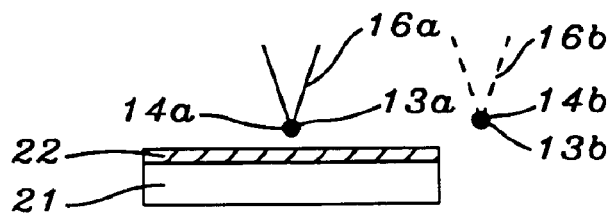
FIG. 3
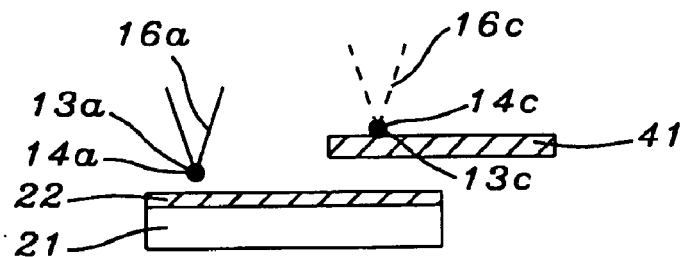
FIG. 4

CONTAMINANT PARTICLE REMOVAL BY OPTICAL TWEEZERS

FIELD OF THE INVENTION

The invention relates to the general field of integrated circuit manufacture with particular reference to the removal of contaminant particles.

BACKGROUND OF THE INVENTION

Contaminant particles are among the most common problems associated with IC (integrated circuit) manufacturing processes. They may cause device yield loss because of photo defocus in successive layers, pattern bridging, contact/via opens, CMP (chemical mechanical polishing) scratching, etc. Current in-line inspection tools, such as KLA (an on-line defect inspection tool produced by KLA-Tensor) make it easy to accurately determine the location and size of contaminant particles on wafers but there is no tool for removing these particles except scrubber cleaners. Unfortunately, scrubber cleaning is not a suitable method for dielectric layers, patterned layers, water-absorbent layers, metal layers (corrosion concern), etc and the device yield loss remains the same even though we know the position of these contaminant particles.

Optical traps, sometimes referred to as optical tweezers, utilize a light source to produce radiation pressure. Radiation pressure is a property of light that creates small forces by absorption, reflection, or refraction of light by a dielectric material. Relative to other types of forces, the forces generated by radiation pressure are almost negligible-only a few picoNewtons. However, a force of only a few picoNewtons is sufficient to allow attachment to particles of the sizes just discussed.

Optical tweezers utilize the force that exists when a transparent material with a refractive index greater than the surrounding medium is placed in a light gradient. As light passes through polarizable material, it induces a dipole moment. This dipole interacts with the electromagnetic field gradient, resulting in a force directed towards the brightest region of the light, normally the focal region. Conversely, if an object has a refractive index less than the surrounding medium, such as an air bubble in water, the object experiences a force drawing it toward the darkest region.

As long as the frequency of the laser is below the natural resonances of the particle being trapped, the dipole moment will be in phase with the driving electric field. A schematic view of a light tweezer setup is illustrated in FIG. 1. Light 11, typically laser light, enters a high numerical aperture objective lens 12 of an optical system and is focused 16 to a diffraction limited region (spot) 13 on a particle 14. Because the intensity profile of the laser light is not uniform, an imbalance in the reaction forces generates a three-dimensional gradient force 15 with the brightest light in the center. The gradient force 15 pulls the object toward the brightest point. Thus, the forces generated by the optical system "traps" the object. Such gradient forces are formed near any light focal region.

The sharper or smaller the focal region 13, the steeper the gradient. To overcome scattering forces near the focal region and hence prevent the object from being ejected along the direction of the light beam, the optical system must produce the steepest possible gradient forces. Sufficiently steep gradient forces can be achieved by focusing laser light to a diffraction-limited spot through a microscope objective of high numerical aperture (N.A.).

A routine search of the prior art was performed with the following references of interest being found:

In U.S. Pat. No. 6,055,106, Grier et al. describe an apparatus for manipulating small dielectric particles. In U.S. Pat. No. 5,953,166, Shikano discloses a laser trapping apparatus while in U.S. Pat. No. 5,689,109 Schutze discloses an apparatus and method for the manipulation, processing and observation of small particles. Weetall et al., in U.S. Pat. No. 5,620,857 use tightly focused laser beams as optical tweezers while Burns et al., in U.S. Pat. No. 5,245,466, create arrays using light beams coupled to microscopic polarizable matter. U.S. Pat. No. 5,079,169 is a method for optically manipulating polymer filaments. Ashkin et al. describe a non-destructive optical trap for biological particles in U.S. Pat. No. 4,893,886. Finally, in U.S. Pat. No. 5,512,745, Finer et al. shows an optical trap system while Ashkin (U.S. Pat. No. 3,808,550), and Shivashankar et al. (U.S. Pat. No. 6,139,831) show optical trap related patents.

SUMMARY OF THE INVENTION

It has been an object of the invention to remove contaminant particles from a surface.

Another object of the invention has been that the act of removing said particles not damage the surface in any way.

A further object has been that the invention allow a choice to be made between removing all particles on the surface and removing only particles that have the potential to damage the surface.

These objects have been achieved by first recording the positional co-ordinates of all particles on the surface. Optionally, only particles that can be expected to cause current or future damage to the surface are included. Then, using optical tweezers, each particle is individually removed and then disposed of. Six different ways to remove particles are described.

BRIEF DESCRIPTION OF THE DRAWINGS

FIG. 1 illustrates the general principle of optical tweezers.

FIG. 2 shows a first embodiment of the invention in which a contaminant particle is removed from a downward facing surface.

FIGS. 3–7 show five variations of a second embodiment of the invention in which a contaminant particle is removed from an upward facing surface.

DESCRIPTION OF THE PREFERRED EMBODIMENTS

Figure 5:
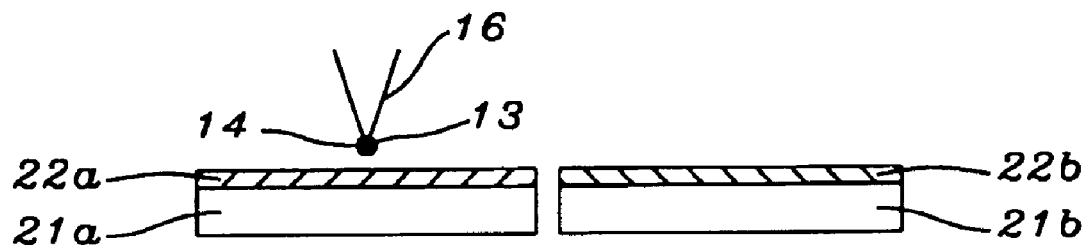

Since optical tweezers have proved to be an effective tool for three dimensional trapping and manipulation of particles, the present invention uses them as its means for removing contaminant particles from the surface of an integrated circuit wafer. The process of the present invention can be divided into three main steps:

(1) Detect and record the location and size of all contaminant particles or, optionally, only selected particles that are predicted to reduce product yield. Typically, particles have a mean diameter between about 0.12 and 0.5 microns, with about 1 micron being an upper limit to what can be handled by optical tweezers at the current state of the art. In the 0.15 micron process, any particle whose size exceeds about 0.25 microns is likely to cause a yield loss. This step is accomplished by using an in-line inspection tool. An example of this is KLA which was mentioned earlier. Optionally, the same lens system used to generate the optical tweezers may also be used for obtaining said positional co-ordinates.

(2) Using the optical tweezers, access each location separately and remove all, or only selected, particles from the semiconductor wafer surface, depending which takes least time (including the time to execute step 1). As a practical matter, the optical system needs to have a NA of at least 0.8 and the light source needs to be a laser (such as Ar or he—Cd) operating with an intensity of at least 10 W.

(3) Dispose of the removed particles, usually, though not necessarily, by reducing the power level (including full turnoff) until the particle is drawn out of the trap by gravitational forces.

1st Embodiment

Referring now to FIG. 2, we show there the first of two embodiments of the invention. Schematically represented is silicon wafer 21 whose lower surface 22 contains one or more integrated circuits. Contaminant particle 14 is seen after it has been drawn away from surface 22 by the light trap 13 at the focal point of focused laser beam 16. This was accomplished by first positioning the lens (12 in FIG. 1) so as to bring the focal point of converging beam 16 directly below where the particle 14 had been sitting on the surface 22 at a distance from the particle of between about 200 and 500 nanometers.

Positioning of the beam 16 was, in turn, achieved by controlling motion of the lens from a data base that contained the coordinates (on the wafer surface) of all particles that were to be removed. Depending on the relative times to populate the data base and to remove particles, all particles on surface 22 could be removed or removal could be limited to particles that, because of their position on the surface, were expected to damage the integrated circuit, either immediately, during later processing, or on life.

A key feature of this embodiment is that a stream of gas (symbolized by arrow 25) is caused to flow past and around wafer 21 in a downward direction. As a consequence, when the power level of the laser is reduced (or made zero), there is no longer sufficient force within the light trap to hold the particle and it gets swept away from the wafer through a combination of gravitational forces and the carrying power of the gas stream.

2nd Embodiment

Referring now to FIG. 3, the first of several variations of the second embodiment is shown. Schematically represented is silicon wafer 21 whose upper surface 22 contains one or more integrated circuits. Contaminant particle 14a is seen after it has been drawn away from surface 22 by the light trap 13a at the focal point of focused laser beam 16a. This was accomplished by first positioning the lens (12 in FIG. 1) so as to bring the focal point of converging beam 16 directly above where the particle 14 had been sitting on the surface 22 at a distance from the particle of between about 200 and 500 nanometers.

Positioning of the beam 16 was, in turn, achieved by controlling motion of the lens from a data base that contained the co-ordinates (on the wafer surface) of all particles that were to be removed. Depending on the relative times to populate the data base and to remove particles, all particles on surface 22 could be removed or removal could be limited to particles that, because of their position on the surface, were expected to damage the integrated circuit, either immediately, during later processing, or on life.

Variation 1: Continuing our reference to FIG. 3, it is seen that disposal of the removed particle 14a is achieved by moving the focal point 13a of the laser to position 13b where particle 14b is no longer above the wafer surface. The laser power level is then reduced or terminated causing particle 14b to be removed by gravity.

Variation 2: Referring now to FIG. 4, as in variation 1, disposal of the removed particle 14a also begins by a lateral movement of focal point 13a to a new position 13c. Unlike variation 1, however, 14c is higher than 14a and continues to be above the wafer. A key feature of variation 2 is that catcher plate 41 is then inserted between focal point 13c and the surface so that when the power level is reduced or terminated, the particle falls onto the catcher plate which is then removed.

Variation 3: Referring now to FIG. 5. This resembles variation 1 in that the light beam and particle do not move. Instead, wafer 21a is moved to position 21b which is sufficiently removed from 21a so that particle 14 is no longer above the wafer surface. The laser power level is then reduced or terminated causing particle 14 to be removed by gravity.

Figure 6:
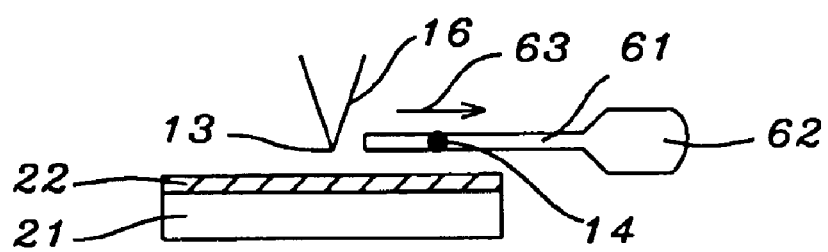

Variation 4: This is illustrated in FIG. 6. Unlike the previous three variations, neither the focal point nor the wafer get moved. Instead, tube 61 is provided. This has one open end with the other end being connected to low pressure chamber 62, low pressure meaning a pressure lower than that at focal point 13. Tube 61 is brought into position so that its open end is close to particle 14 at which point the particle gets pulled out of the light trap, moving along direction 63 and getting sucked into tube 61 and thence into low pressure container 62. Typically the pressure at focal point 13 would be about atmospheric or low pressure chamber 62 could be used.

Figure 7:
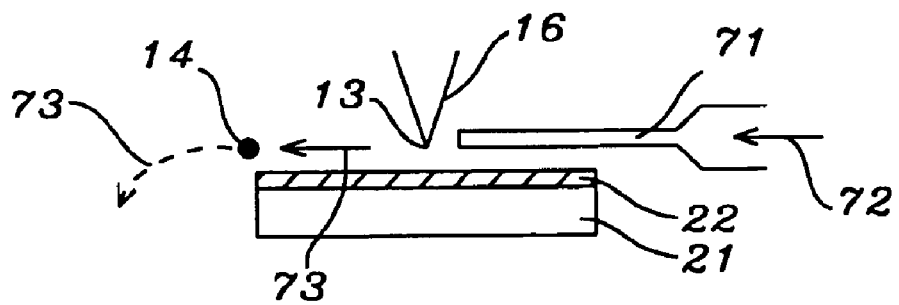

Variation 5: This is illustrated in FIG. 7. Here too neither the focal point nor the wafer get moved. Instead, tube 71 is provided. This has one open end with the other end being connected to pressure source 72. Tube 71 is brought into position so that its open end is close to particle 14 at which point the particle gets pushed out of the light trap, moving along direction/trajectory 73 and not falling below the level of surface 22 until it is clear of the wafer. Typically the pressure at focal point 13 would be about atmospheric.

While the invention has been particularly shown and described with reference to the preferred embodiments thereof, it will be understood by those skilled in the art that various changes in form and details may be made without departing from the spirit and scope of the invention.

What is claimed is:

1. A process for removing contaminants from a surface of a semiconductor wafer, comprising:

providing a source of laser light and a lens system capable of focusing said laser light to a focal point;

obtaining positional co-ordinates, on the wafer surface, for a particle;

using said positional co-ordinates, placing the lens so that the focal point is directly in line with said particle and at a distance therefrom;

passing said laser light through the lens at a power level sufficient to form, at said focal point, an optical trap into which said particle is drawn; and disposing of the particle while reducing the power level until the particle is drawn out of the trap by gravitational forces whereby it is not returned to the wafer surface.

2. The process described in claim 1 wherein the particle has a mean diameter less than about 1 micron.

3. The process described in claim 1 wherein the lens system has a numerical aperture greater than about 0.8.

4. The process described in claim 1 wherein the power level of the laser is at least about 10 W.

5. The process described in claim 1 wherein the lens system is used for obtaining said positional co-ordinates.

6. The process described in claim 1 wherein said surface further comprises an integrated circuit and said positional co-ordinates are such that the particle has a non-zero probability of damaging said circuit.

7. The method of claim 1 wherein said distance between the particle and the focal point is between about 200 and 500 nanometers.

8. A process for removing contaminant particles from a downward-facing surface of a semiconductor wafer, comprising:

providing a source of laser light and a lens system capable of focusing said laser light to a focal point;

obtaining positional co-ordinates, on the wafer surface, for a set of said particles;

providing a stream of gas that flows past and around the wafer in a downward direction;

performing the sequential steps of:

(a) using said positional co-ordinates, placing the lens so that the focal point is directly below a particle of the set at a distance therefrom;

(b) passing said laser light through the lens at a power level sufficient to form, at said focal point, an optical trap into which said particle is drawn;

(c) reducing said power level whereby the particle is removed through a combination of gravitational forces and said stream of gas; and repeating steps (a), (b), and (c) for all other member of the set of particles.

9. The process described in claim 8 wherein the particles have mean diameters less than about 1 micron.

10. The process described in claim 8 wherein the lens system has a numerical aperture greater than about 0.8.

11. The process described in claim 8 wherein the power level of the laser is at least about 10 W.

12. The process described in claim 8 wherein said distance between a particle and the focal point is between about 200 and 500 nanometers.

13. The process described in claim 8 wherein the set of particles consists of all particles on the wafer surface.

14. The process described in claim 8 wherein said surface further comprises an integrated circuit and the set of particles consists of all particles that have a non-zero probability of damaging said circuit.

15. A process for removing contaminant particles from an upward-facing surface of a semiconductor wafer, comprising:

providing a source of laser light and a lens system capable of focusing said laser light to a focal point;

obtaining positional co-ordinates, on the wafer surface, for a set of said particles;

performing the sequential steps of:

(a) using said positional co-ordinates, placing the lens so that the focal point is directly above a particle of the set at a distance therefrom;

(b) passing said laser light through the lens at a power level sufficient to form, at said focal point, an optical trap into which said particle is drawn;

(c) disposing of the particle by moving the focal point until it is no longer above the wafer surface and reducing said power level whereby the particle is removed by gravity and not returned to the wafer surface; and repeating steps (a), (b), and (c) for all other member of the set of particles.

16. The process described in claim 15 wherein the step of disposing of the particle further comprises:

increasing the distance between the focal point and the wafer surface;

inserting a catcher plate between the focal point and the surface;

reducing said power level whereby the particle falls onto the catcher plate; and removing the catcher plate.

17. The process described in claim 15 wherein the step of disposing of the particle further comprises moving the wafer until it is no longer beneath the focal point and then reducing said power level whereby the particle is removed by gravity.

18. The process described in claim 15 wherein the step of disposing of the particle further comprises:

providing a tube having a first end that is open and a second end that is connected to a container maintained at a pressure lower than that at the focal point; and positioning the tube so that said open end is near the particle being held in the light trap, thereby sucking the particle out of the light trap into said low pressure container.

19. The process described in claim 15 wherein the step of disposing of the particle further comprises:

providing a tube having a first end that is open and a second end that is connected to a source of pressure that is higher than that at the focal point; and positioning the tube so that said open end is near the particle being held in the light trap, thereby blowing the particle out of the light trap and away from the wafer.

20. The process described in claim 15 wherein the set of particles consists of all particles on the wafer surface.

21. The process described in claim 15 wherein said surface further comprises an integrated circuit and the set of particles consists of all particles that have a non-zero probability of damaging said circuit.

* * * * *